(12) United States Patent
Hashimoto

(10) Patent No.: US 7,781,337 B2
(45) Date of Patent: Aug. 24, 2010

(54) FORMING METHOD OF SILICIDE FILM

(75) Inventor: Keiichi Hashimoto, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 640 days.

(21) Appl. No.: 11/642,894

(22) Filed: Dec. 21, 2006

(65) Prior Publication Data

US 2007/0105371 A1 May 10, 2007

Related U.S. Application Data

(62) Division of application No. 10/900,278, filed on Jul. 28, 2004, now Pat. No. 7,176,134, which is a division of application No. 10/233,435, filed on Sep. 4, 2002, now abandoned.

(30) Foreign Application Priority Data

Dec. 28, 2001 (JP) .............................. 2001/400005

(51) Int. Cl.
*H01L 21/44* (2006.01)
(52) U.S. Cl. ................................ 438/655; 257/E21.204
(58) Field of Classification Search ................. 438/592, 438/630, 655, 682, 683, 976; 257/E21.204
See application file for complete search history.

(56) References Cited

U.S. PATENT DOCUMENTS

| 5,240,880 | A | * | 8/1993 | Hindman et al. ............ 438/656 |
|---|---|---|---|---|
| 5,567,651 | A | | 10/1996 | Berti et al. |
| 5,736,461 | A | | 4/1998 | Berti et al. |
| 5,902,129 | A | * | 5/1999 | Yoshikawa et al. .......... 438/592 |
| 5,970,370 | A | | 10/1999 | Besser et al. |
| 5,972,178 | A | | 10/1999 | Narasimhan et al. |
| 6,136,705 | A | | 10/2000 | Blair |
| 6,221,764 | B1 | | 4/2001 | Inoue |
| 6,303,503 | B1 | | 10/2001 | Kamal et al. |

FOREIGN PATENT DOCUMENTS

| JP | 06-240449 | 8/1994 |
|---|---|---|
| JP | 08-264482 | 10/1996 |
| JP | 09-190986 | 7/1997 |
| JP | 11-283935 | 10/1999 |

* cited by examiner

*Primary Examiner*—David Vu
(74) *Attorney, Agent, or Firm*—Volentine & Whitt, P.L.L.C.

(57) ABSTRACT

A manufacturing method of a semiconductor device includes forming a cobalt film on a silicon substrate on which a diffusion layer is formed, forming a titanium film on the cobalt film using a titanium target that has a surface from which a nitride film has previously been removed, forming a titanium nitride film on the titanium film in accordance with a reactive sputtering process using a gas containing a nitrogen atom and the titanium target, and performing a heat treatment to react the cobalt film with the silicon substrate, thereby accomplishing silicification.

7 Claims, 4 Drawing Sheets

FORMING METHOD OF SILICIDE FILM

CROSS REFERENCE TO RELATED APPLICATIONS

This is a divisional application of application Ser. No. 10/900,278, filed on Jul. 28, 2004, now U.S. Pat. No. 7,176,134 which is a divisional application of application Ser. No. 10/233,435, filed Sep. 4, 2002 and now abandoned, which are hereby incorporated by reference in their entirety for all purposes.

BACKGROUND OF THE INVENTION

1. Field of the Invention

The present invention relates to a forming method of a silicide film, i.e., a method for forming an excellent cobalt silicide film, and particularly, it relates to a formation of titanium nitride on a cobalt film.

2. Description of Related Art

A typical method for forming cobalt silicide will be described with reference to FIG. 1. First, a silicone substrate is subjected to element separation by the use of a conventional technique to form a shallow trench isolation (STI) area and an active area in which a diffusion layer 100 is formed (FIG. 1A).

Subsequently, a natural oxide film on the diffusion layer 100 is removed as a pretreatment for depositing a cobalt (Co) film 101. The oxide film remained at an interface between the diffusion layer 100 and the cobalt film 101 disturbs the silicification of the cobalt film 101. In a typical method for removing the natural oxide film, a treatment of ammonia peroxide mixture (APM) and buffered hydrofluoric acid (BHF) is done for 60 seconds (this is corresponding to etching conditions for a thermal oxidation film of 20 Å), and further, an isopropylalcohol (IPA) drying is done.

Next, following steps are performed successively using a multi-chamber-sputter equipment. It is preferable to perform the steps successively because an oxidation of the substrate surface can be prevented and the silicification of the cobalt film 101 grows excellently thereby. Moreover, the sputter equipment is preferably used for processing the sequential steps successively. First, the substrate for treatment is carried in, thereafter a degassing is done, then ion of ionized sputter-gas (commonly argon) is directly irradiated onto the substrate to remove the natural oxide film remained on the surface of the substrate by a sputter-cleaning. After that, the cobalt film 101 is deposited in 60 Å using a cobalt target, and a titanium nitride (TiN) film 102 is deposited in 200 Å using a nitrogen ($N_2$) and a titanium target (FIG. 1B). The titanium nitride film is common as a cap for the cobalt film during annealing.

Herein, for the conditions of respective treatments, the degassing is done at 300° C. for 60 seconds, the sputter-cleaning is done under the conditions that RF (60 MHz) is 360 W, HF (400 kHz) is 90 W, an argon flow rate is 40 sccm, and a process time is 13 seconds (this is corresponding to the etching conditions of the thermal oxide film of 40 Å). The sputter of cobalt is done by a collimation sputter under DC power of 1 kW, temperature of 200° C., respective argon flow rates of 15 sccm and 4 sccm in a chamber and a holder, and the process time of 28 seconds, and the sputter of titanium nitride is done under DC power of 2.5 kW, no heating, respective argon flow rates of 38 sccm and 4 sccm in the chamber and the holder, the nitrogen flow rate of 43 sccm, and the process time of 32 seconds.

At that time, the titanium nitride film is formed by a reactive sputter, where the titanium ejected from the titanium target is reacted with the nitrogen flowed into the chamber, resultantly titanium nitride is deposited on the substrate. While titanium nitride cannot be formed essentially unless titanium is heated at 800° C. or more in nitrogen atmosphere, the deposition is done under a non-thermal equilibrium state without heating, therefore titanium nitride contains certain titanium which is not reacted with nitrogen. When a cobalt monosilicide is formed by a first annealing in a later step, this titanium in titanium nitride plays an important role.

Typically, the natural oxide film is remained slightly on the diffusion layer even though the pretreatment and the sputter-cleaning are performed. It is considered that after titanium diffuses through cobalt and comes into the interface with the silicon wafer during the first annealing, titanium reduces the slightly remained natural oxide film and generates a silicide formable state for cobalt because it functions to reduce the oxide film. However, a single titanium film is not preferable for the cap film. It is because the single titanium also forms an alloy of cobalt and titanium, leading to difficulty for control of a thickness of cobalt silicide.

In this way, an RTA (Rapid Thermal Anneal) treatment as the first annealing is performed at 550° C. for 30 seconds under the nitrogen of 10 $dm^3$/min so as to change the cobalt film 101 on the diffusion layer 100 in the active area to the cobalt monosilicide (CoSi) film 103 (FIG. 1C).

Then, the unreacted cobalt film 101 and the titanium nitride film 102 on the STI is removed by a batch type spray cleaning equipment, and the cobalt monosilicide film 103 is left only on the diffusion layer 100 (FIG. 1D). Finally, the RTA treatment as the second annealing is performed at 850° C. for 30 seconds under the nitrogen of 10 $dm^3$/min so as to change the cobalt monosilicide film 103 on the diffusion layer 100 to the cobalt disilicide ($CoSi_2$) film, consequently the formation of cobalt silicide is completed (not shown).

Now, in the above method, cobalt silicide is not formed excellently at the active area edges, as shown in the defect portion 104 in FIG. 1D. This is because the titanium target is nitrided due to the nitrogen flowed into the chamber of the sputter equipment when the titanium nitride film is formed by the reactive sputter, and excessive nitrogen atoms are supplied to the interface between the underlaid cobalt film and the titanium nitride film when the sputter of titanium nitride is performed onto the subsequently carried-in substrate. If the excessive nitrogen atoms exist, titanium in the titanium nitride film lowers its reduction function, the natural oxide film on the active area is hardly to be reduced, and the silicification of cobalt is restrained. It is considered that the reason why the defects occur at the active area edges is because the natural oxide film is apt to remain there.

The invention has been developed in consideration of the above problems that exists in conventional manufacturing methods of semiconductor devices, particularly the formation method of cobalt silicide. The invention intends to provide a novel and improved manufacturing method of the semiconductor device, which prevents the lowering of the reduction function of titanium in the titanium nitride film due to the excessive nitrogen atoms, allows the natural oxide film on the active area to be reduced and enhanced the silicification of cobalt, and enables the excellent cobalt silicide to be formed.

SUMMARY OF THE INVENTION

To solve the above problems, according to the first aspect of the invention, there is provided a manufacturing method of a semiconductor device which comprises a first step of forming a cobalt film on a silicon substrate on which a diffusion layer is formed, a second step of forming a titanium nitride film containing titanium on the cobalt film by a reactive sputtering process using a titanium target from which the nitride film on its surface has been previously removed, and a third step of performing a heat treatment to react the cobalt film with the silicon substrate, thereby accomplishing silicification.

In this way, by forming the titanium nitride film using the titanium target from which the nitride film on it surface has been previously removed, titanium effectively reduces the natural oxide film on the active layer during the heat treatment and the excellent silicification can be occurred.

Moreover, the nitride film on the titanium target is preferably removed by sputtering the titanium target (the target-cleaning method).

The target-cleaning method is a process that gas is evacuated from a processing chamber, then the sputter treatment is performed on the titanium target, and thus titanium nitride on the titanium target is removed. In this manner, the nitride film on the titanium target can be removed easily.

Further, the nitride film on the titanium target is preferably removed after the second step.

Thus, when the titanium nitride film is formed on the cobalt film, a pure titanium target can be always used and titanium nitride having the excessive nitrogen is never formed.

Further, the gas of which composition contains the nitrogen atoms is preferably the nitrogen gas.

Hereby, the titanium nitride film can be formed by the reactive sputtering process using the gas of which composition contains the nitrogen, and the titanium target.

Moreover, the first step is preferably performed under low temperature conditions such that the titanium nitride film may contain titanium, for example, the temperature conditions of the silicon substrate of 50° C. to 100° C.

The unreacted titanium contained in the titanium nitride film can be ensured sufficiently by performing the sputter treatment under such low temperature conditions.

Moreover, the third step preferably includes a first annealing step for changing the cobalt film on the diffusion layer to the cobalt monosilicide film, and the second annealing step for removing the titanium nitride film containing titanium and the unreacted cobalt film, then changing the cobalt monosilicide film to the cobalt disilicide film under higher temperature conditions than that of the first annealing step.

Thus, the cobalt disilicide film having a lower resistance than that of the cobalt monosilicide film can be formed by performing the second annealing step after performing the first annealing step to form the cobalt monosilicide film.

Further, the steps from the first step to the first annealing step of the third step are preferably performed successively in the same equipment.

Thus, in the steps from the formation of the cobalt film to the first annealing treatment, since the substrate is not required to be carried out in the atmosphere, the oxidation of the titanium nitride film containing titanium as the cap film can be prevented and the excellent silicide film can be formed.

BRIEF DESCRIPTION OF THE DRAWINGS

FIG. 1A shows the cross sectional view after forming the diffusion layer on the silicon substrate, FIG. 1B shows the cross sectional view after depositing the cobalt film and the titanium nitride film sequentially by the sputter equipment, FIG. 1C shows the cross sectional view after changing cobalt into the cobalt monosilicide by the RTA treatment, and FIG. 1D shows the cross sectional view after removing the unreacted cobalt and leaving the cobalt monosilicide only on the diffusion layer.

FIG. 2A is the cross sectional view after forming the diffusion layer on the silicon substrate, FIG. 2B is the cross sectional view after depositing the cobalt film, the titanium nitride film, and the titanium film sequentially by the sputter equipment, FIG. 2C is the cross sectional view after changing the cobalt film to the cobalt monosilicide film by the RTA treatment, and FIG. 2D is the cross sectional view after removing the unreacted cobalt and leaving cobalt monosilicide only on the diffusion layer.

FIG. 3A is the cross sectional view after forming the diffusion layer on the silicon substrate, FIG. 3B is the cross sectional view after depositing the cobalt film, the titanium film, the titanium nitride film, and the titanium film sequentially by the sputter equipment, FIG. 3C is the cross sectional view after changing cobalt to cobalt monosilicide by the RTA treatment, and FIG. 3D is the cross sectional view after removing the unreacted cobalt and leaving cobalt monosilicide only on the diffusion layer.

DETAILED DESCRIPTION OF THE INVENTION

Hereinafter, preferred embodiments of the manufacturing method of the semiconductor device according to the invention will be described in detail with reference to the drawings. In this specification and the drawings, repeated description is avoided with regard to components having substantially identical functions and constructions by marking same symbols thereto.

First Embodiment

The first embodiment of the invention is shown in FIG. 2. First, the silicon substrate is isolated using the conventional technique, the STI area and active area are formed, and the diffusion layer 200 is formed in the active area (FIG. 2A). Subsequently, the treatment of the ammonia peroxide mixture and buffered fluorinate acid is done for 60 seconds (this is corresponding to the etching conditions of the thermal oxidation film of 20 Å), in addition, isopropylalcohol-drying is performed.

Next, following steps are performed successively by the multi-chamber sputter equipment. First, the degassing is done, next the sputter-cleaning is done, then the cobalt film 201 is deposited in 60 Å, and the titanium nitride film is deposited in 200 Å. Herein, conditions of the processes except for the sputter step of titanium nitride are the same as that of the prior art: the degassing is done at 300° C. for 60 seconds, and the sputter-cleaning is done under the conditions that RF (60 MHz) is 360 W, HF (400 kHz) is 90 W, the argon flow rate is 40 sccm, and the process time is 13 seconds (this is corresponding to the etching conditions of the thermal oxidation film of 40 Å). Moreover, the sputter of cobalt is performed by the collimation sputter under DC power of 1 kW, temperature of 200° C., respective argon flow rates of 15 sccm and 4 sccm in the chamber and the holder, and the process time of 28 seconds, and the sputter of titanium nitride is performed under DC power of 2.5 kW, no heating, respective argon flow rates of 38 sccm and 4 sccm in the chamber and the holder, the nitrogen flow rate of 43 sccm, and the process time of 32 seconds.

At the time, temperature of the surface of the silicon substrate rises even though heating is not achieved because the surface is exposed to plasma. The temperature of the silicon substrate is low, about 50° C. to 100° C. at that time. The unreacted titanium contained in titanium nitride is secured sufficiently by sputtering at such low temperature conditions.

Figure 1A:
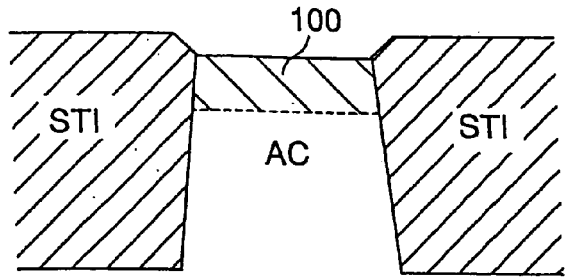
FIG. 1A to FIG. 1D are cross sectional views of steps showing the manufacturing method of the semiconductor device according to a prior art.
Figure 1B:
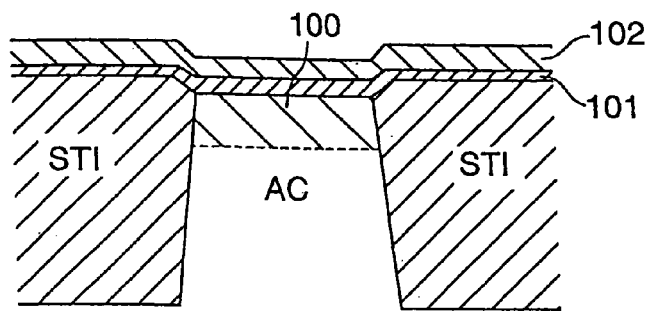
Figure 1C:
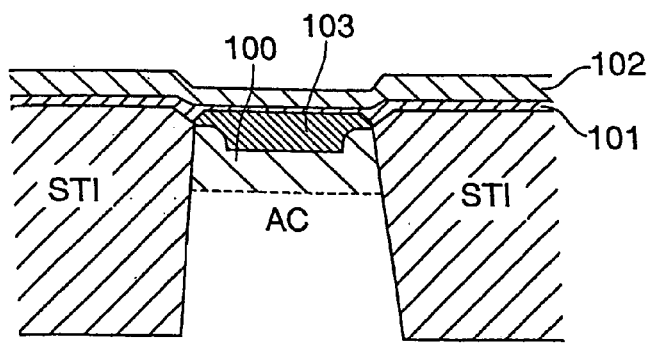
Figure 1D:
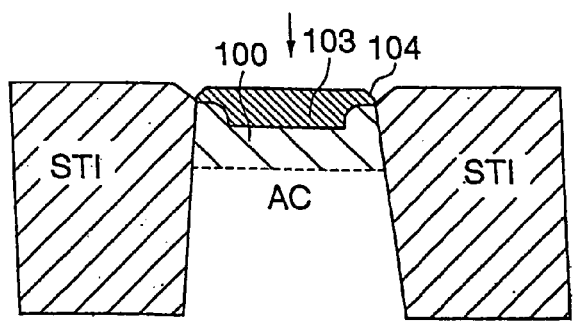
Figure 2A:
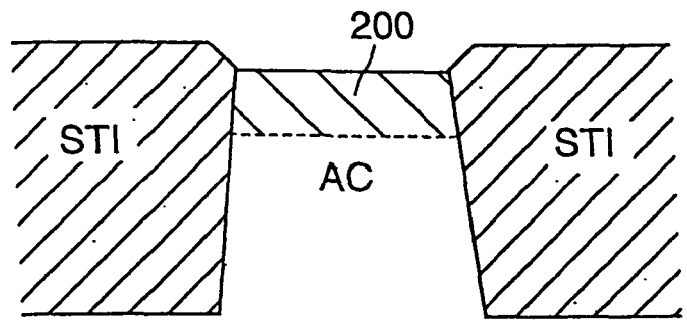
FIG. 2A to FIG. 2D are cross sectional views of steps showing the manufacturing method of the semiconductor device according to the first embodiment of the invention.
Figure 2B:
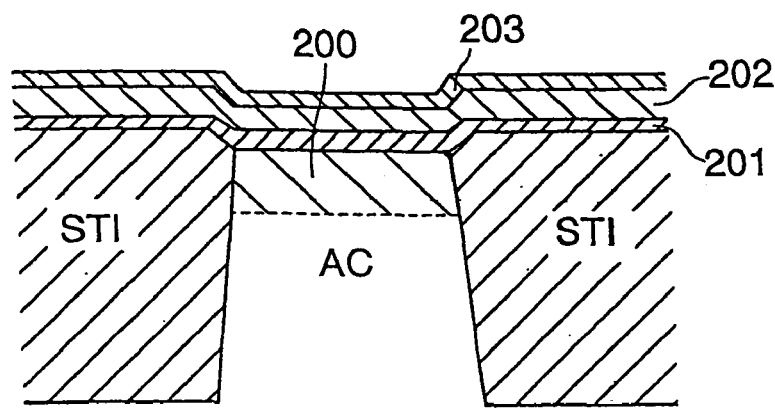

Herein, the cleaning of the titanium target nitrided by the sputter of titanium nitride is done by the target-cleaning method shown as followed. That is, following the sputter of titanium nitride at step 1, the supply of the nitrogen is ended and only the argon is supplied (step 2), then the sputter is performed (step 3). The step 2 and 3 are called as target-cleaning steps. Hereby, the titanium film 203 is formed in about 50 Å on the titanium nitride film 202 (FIG. 2B). That is, by performing the sputter of titanium and shaving the surface of the titanium target, the surface being nitrided through the sputter of titanium nitride, the target surface becomes of pure titanium, as a result the surface is cleaned. Herein, it is also possible that a shutter installed within the chamber is closed and titanium is deposited on the shutter, thereby the titanium film 203 is not deposited on the titanium nitride film 202.

Figure 2C:
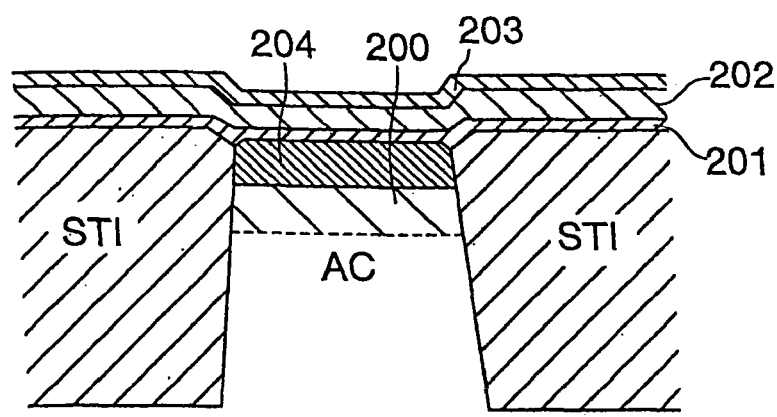
Figure 2D:
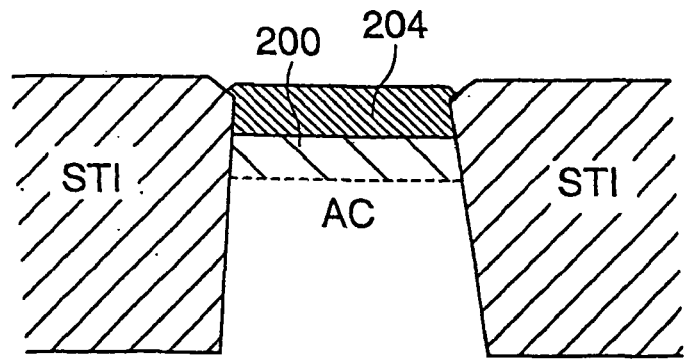

Further, the RTA (Rapid Thermal Anneal) treatment as the first annealing is performed at 550° C. for 30 seconds under the nitrogen of 10 dm$^3$/min so as to change the cobalt film 201 on the diffusion layer 200 in the active area to the cobalt monosilicide film 204 (FIG. 2C). Then, by the batch type spray-cleaning equipment (for example, Mercury), the treatments of peroxide for 30 seconds, the ammonia peroxide mixture for 240 seconds, and peroxide for 30 seconds are performed, further succeedingly a sulfuric acid peroxide mixture treatment is performed for eight cycles (one cycle comprises the sulfuric acid peroxide mixture spray for 60 seconds, leaving for 60 seconds, and the spray of the sulfuric acid peroxide mixture), the titanium film 203, the titanium nitride film 202, and the unreacted cobalt film 201 on the shallow trench isolation (STI) area are removed, and the cobalt monosilicide film 204 is left only on the diffusion layer 200 (FIG. 2D). Finally, the RTA treatment as the second annealing is performed at 850° C. for 30 seconds under the nitrogen of 10 dm$^3$/min so as to change the cobalt monosilicide film 204 on the diffusion layer 200 to the cobalt disilicide film, consequently the formation of cobalt silicide is completed (not shown).

As mentioned above, according to the first embodiment, since the target-cleaning step is established in the formation steps of the titanium nitride film, the surface of the titanium target is always of pure titanium before the sputter of titanium nitride. Hereby, the nitrogen atoms at the interface between cobalt and titanium nitride are decreased, the reduction function of titanium is enhanced, and the excellent cobalt silicide can be formed all over the active layer.

Second Embodiment

The second embodiment of the invention is shown in FIG. 3. The silicon substrate is isolated using the conventional technique, the STI area and the active area are formed, and the diffusion layer 300 is formed in the active area (FIG. 3A). Subsequently, in order to remove the natural oxidation film on the diffusion layer 300, the treatment of the ammonia peroxide mixture and buffered hydrofluoric acid is performed for 60 seconds (this is corresponding to the etching conditions of the thermal oxidation film of 20 Å), in addition, the isopropylalcohol-drying is performed.

Figure 3A:
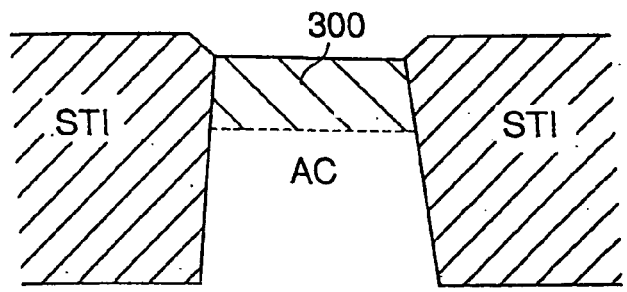
FIG. 3A to FIG. 3D are cross sectional views of steps showing the manufacturing method of the semiconductor device according to the second embodiment of the invention.
Figure 3B:
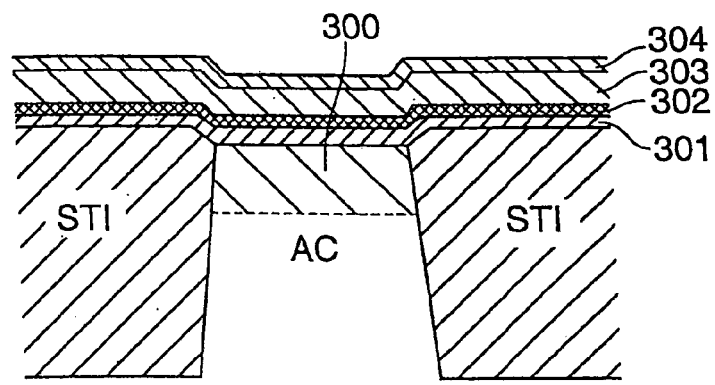

Next, the following steps are performed successively by the multi-chamber sputter equipment. First the degassing is done, next the sputter-cleaning is done, then the cobalt film 301 is deposited in 60 Å, the titanium film 302 is deposited in 50 Å, the titanium nitride film 303 is deposited in 300 Å, and the titanium film 304 is deposited in 50 Å (FIG. 3B). Herein, for the respective treatment conditions, the degassing is done at 300° C. for 60 seconds, the sputter-cleaning is done under the conditions that RF (60 MHz) is 360 W, HF (400 kHz) is 90 W, the argon flow rate is 40 sccm, and the process time is 13 seconds (this is corresponding to the etching conditions of the thermal oxidation film of 40 Å). Moreover, the sputter of cobalt is done by the collimation sputter under DC power of 1 kW, the temperature of 200° C., respective argon flow rates of 15 sccm and 4 sccm in the chamber and the holder, and the process time of 28 seconds, the sputter of titanium is done under DC power of 1 kW, no heating, the argon flow rate of 32 sccm, and the process time of 8 seconds, and the sputter of titanium nitride is done under DC power of 2.5 kW, no heating, respective argon flow rates of 38 sccm and 4 sccm in the chamber and the holder, the nitrogen flow rate of 43 sccm, and the process time of 32 seconds.

The deposition of the titanium film 304 on the titanium nitride film 303 is the same as in the cleaning treatment of the titanium target, that is, the surface of the titanium target is of pure titanium. Besides, it is also possible that the shutter installed within the chamber is closed and titanium is deposited on the shutter, thereby the titanium film 304 is not deposited on the titanium nitride film 303.

Figure 3C:
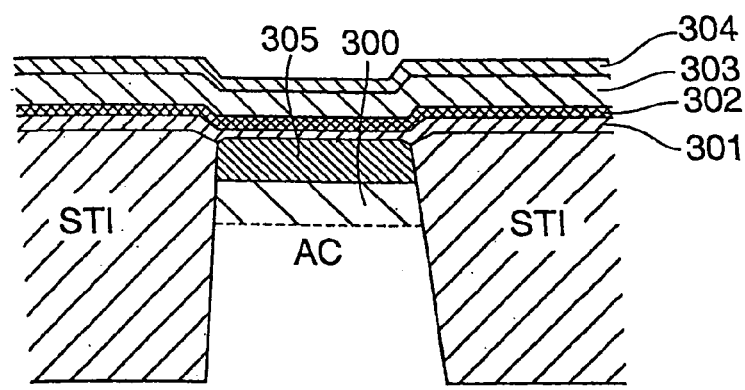
Figure 3D:
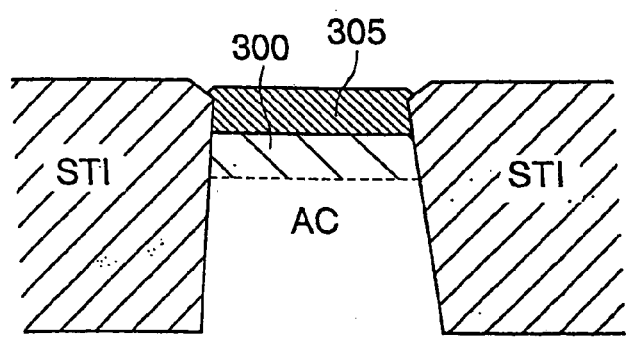

Further, the RTA (Rapid Thermal Anneal) treatment as the first annealing is performed at 550° C. for 30 seconds under the nitrogen of 10 dm$^3$/min so as to change the cobalt film 301 on the diffusion layer 300 in the active area to the cobalt monosilicide film 305 (FIG. 3C). Then, by the batch type spray cleaning equipment (for example, Mercury) as the first embodiment, the treatments of peroxide for 30 seconds, the ammonia peroxide mixture for 240 seconds, and peroxide for 30 seconds are performed, and succeedingly a sulfuric acid peroxide mixture treatment is performed for 8 cycles, then the titanium film 304, the titanium nitride film 303, the titanium film 302, and the unreacted cobalt film 301 on the STI are removed, and the cobalt monosilicide film 305 is left only on the diffusion layer 300 (FIG. 3D). Finally, the RTA treatment as the second annealing is performed at 850° C. for 30 seconds under the nitrogen of 10 dm$^3$/min so as to change the cobalt monosilicide film 305 on the diffusion layer 300 to the cobalt disilicide film, consequently cobalt silicide is completed (not shown).

As mentioned above, according to the second embodiment, since a stack of the titanium film 302, the titanium nitride film 303, and the titanium film 304 is used for the cap film of the cobalt film 301, the reduction function according to the ultra-thin titanium film 302 on the cobalt film 301 is enhanced, and the excellent cobalt silicide film can be obtained.

Moreover, in case of the titanium nitride cap film, defects occur at the active area edges after the second annealing (850° C., 30 seconds). That is, in the process of the change to the disilicide during the heat treatment at high temperature, cohesion and a grain growth occur, and when grooves among respective grains grow deep, the groove is torn and the defects occur especially at the edges. However, in case of the titanium/titanium nitride/titanium cap in the second embodiment, it has been known experimentally that the above defective inferiority is not appeared, and a sharp and excellent edge profile can be obtained.

Third Embodiment

Figure 4:
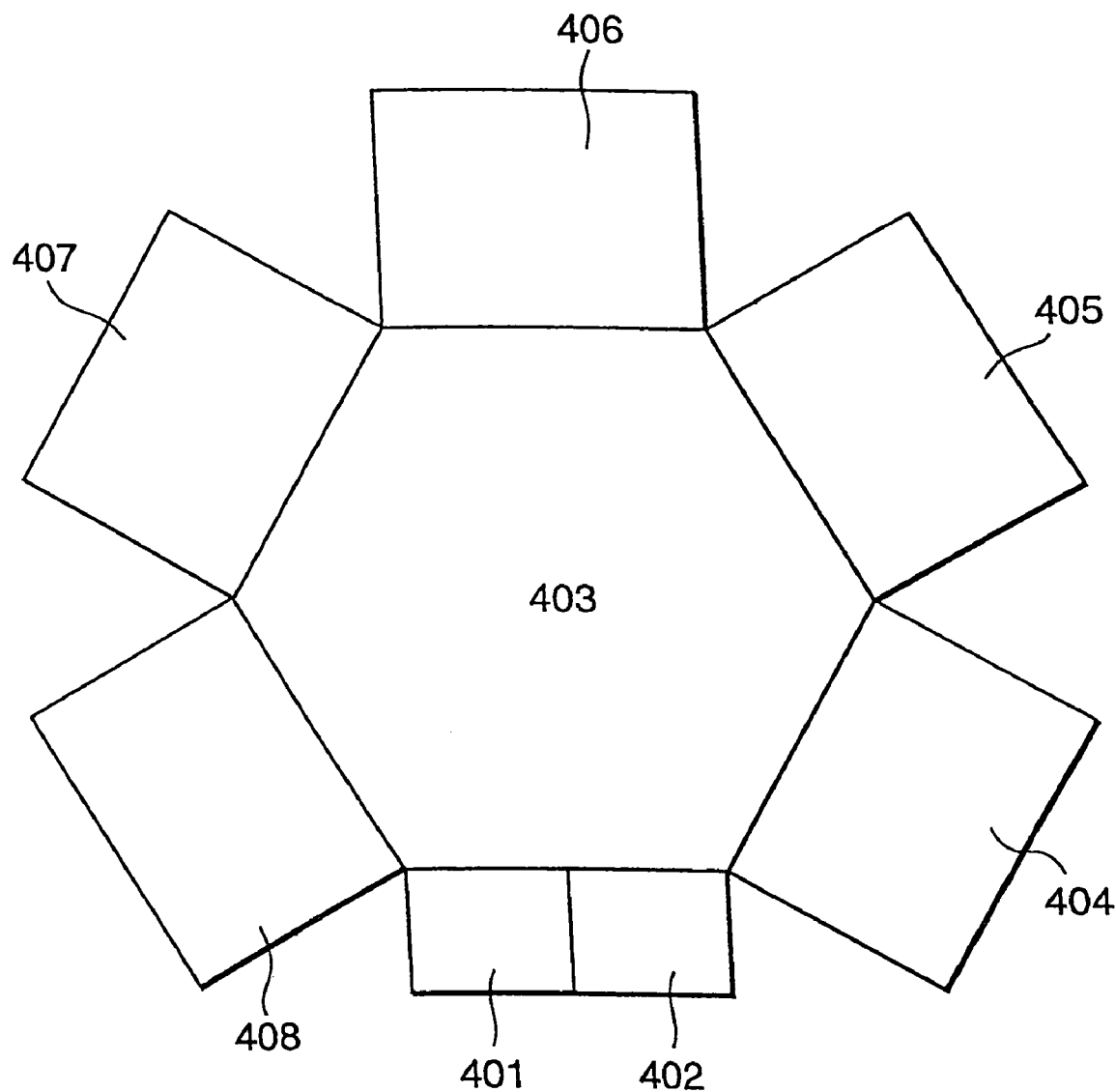
FIG. 4 is an explanatory view showing a construction of a process integration chamber for use in the manufacturing method of the semiconductor device according to the third embodiment of the invention.

The construction of the equipment for use in the third embodiment of the invention is shown in FIG. 4. Each of chambers has been evacuated. Herein, the method for achieving the first embodiment is described using the equipment shown in FIG. 4. The silicon substrate is isolated using the conventional technique and the STI area and the active area are formed, as shown in FIG. 2A. Herein, in order to remove the natural oxide film on the diffusion layer 200 formed in the active area, the treatment of the ammonia peroxide mixture and buffered hydrofluoric acid is done for 60 seconds (this is corresponding to the etching conditions of the thermal oxidation film of 20 Å), in addition, the isopropylalcohol-drying is performed.

Next, the substrate is introduced into a load lock chamber 401 (or the load lock chamber 402), and introduced into a preheat chamber 404 via a separation chamber 403, and then the degassing is done, for example, at 300° C. for 60 seconds. Then, it is transferred into the sputter-cleaning chamber (or chemical-dry-etching chamber) 405 via the separation chamber 403 again, and cleaned under the conditions that, for example, RF (60 MHz) is 360 W, HF (400 kHz) is 90 W, the argon flow rate is 40 sccm, and the process time is 13 seconds (this is corresponding to the etching conditions of the thermal oxidation film of 40 Å).

Next, it is transferred into a cobalt sputter chamber 406 via the separation chamber 403 again, and the cobalt film 201 is deposited in 60 Å under the conditions that, for example, DC power is 1 kW, the temperature is 200° C., the argon flow rates are 15 sccm and 4 sccm in the chamber and the holder respectively, and the process time is 28 seconds. Subsequently, it is transferred into a titanium/titanium nitride sputter chamber 407 via the separation chamber 403 again, and the titanium nitride film 202 is deposited in 200 Å under the conditions that, for example, DC power is 2.5 kW, no heating is performed, the argon flow rates are 38 sccm and 4 sccm in the chamber and the holder respectively, the nitrogen flow rate is 43 sccm, and the process time is 32 seconds, further in the same chamber, as the target-cleaning, the target is cleaned and the titanium film 203 is deposited in 50 Å on the titanium nitride film 202 under the conditions that, for example, DC power is 1 kW, no heating is performed, the argon flow rate is 32 sccm, and the process time is 8 seconds (FIG. 2B). As the first embodiment, it is also possible that the shutter installed within the chamber is closed and the titanium film 203 is not deposited on the titanium nitride film 202.

Thereafter, the silicon substrate is not carried out in the atmosphere, and transferred to a vacuum-annealing chamber 408 via the separation chamber 403 again, then the first annealing is done in vacuum, for example, at 500° C. for 30 seconds so as to change the cobalt film 201 on the diffusion layer 200 in the active area to the cobalt monosilicide film 204 (FIG. 2C). The vacuum-annealing chamber 408 is evacuated at $10^{-5}$ Torr or less so that the substrate can be heated in a range from 400° C. to 600° C. Finally, it is returned to the load lock chamber 401 (or the load lock chamber 402), carried out in the atmosphere, and thus a series of processes are completed.

Subsequently, by the batch type spray cleaning equipment as the first and the second embodiments, the treatments of peroxide for 30 seconds, the ammonia peroxide mixture for 240 seconds, and peroxide for 30 seconds are done, and succeedingly the sulfuric acid peroxide mixture treatment is done for 8 cycles, then the titanium film 203, the titanium nitride film 202, and the unreacted cobalt film 201 on the STI are removed, and the cobalt monosilicide film 204 is left only on the diffusion layer 204 (FIG. 2D). Finally, the RTA treatment as the second annealing is performed at 850° C. for 30 seconds under the nitrogen of 10 dm$^3$/min so as to change the cobalt monosilicide film 204 on the diffusion layer 200 to the cobalt disilicide film, consequently cobalt silicide is completed (not shown).

As mentioned above, according to the third embodiment, since the titanium nitride-film 202/titanium-film 203 as the cap on the cobalt film 201 can be annealed without being exposed to the atmosphere, the cap film is not oxidized to enhance the reduction function of titanium, and the excellent cobalt silicide can be formed.

Hereinbefore, although the preferred embodiments of the manufacturing method of the semiconductor device according to the invention has been described with reference to the accompanying drawings, the invention is not limited to such examples. It is appreciated that various alteration and modification may be realized by those skills in the art within a scope of the technical idea described in claims, and it is also recognized that they naturally belong to a technical scope of the invention.

While an example in case the nitrogen gas is introduced into the sputter equipment has been described in the above embodiments, the invention is not limited to this. The gas introduced in the sputter equipment is available what it comes to the gas of which composition contains the nitrogen atoms, for example, the ammonia gas (NH$_3$) and the like can be used.

As described above, according to the invention, the natural oxide film on the active layer is effectively reduced during annealing, and the excellent silicification can be occurred. To this end, the target-cleaning step is established during the sputter of titanium nitride as the cap film, so that the surface of the nitrided titanium target is always of pure titanium. Thus, it is avoided that the excessive nitrogen atoms are supplied to restrain the reduction function of titanium, thereby the excellent silicification can be occurred. Also, the underlaid titanium film can be more enhanced its reduction function by making the cap film to be a stack of the titanium-film/titanium nitride-film. Also, by using the equipment which is integrated respective steps without exposing the substrate to the atmosphere from the formation of the cobalt film to the annealing, the cap film is not oxidized to allow the reduction function of titanium to be enhanced, and the excellent cobalt silicide can be formed.

What is claimed is:

1. A forming method of a silicide film comprising:
    forming a cobalt film on a silicon substrate on which a diffusion layer is formed;
    forming a titanium film on the cobalt film using a titanium target that has a surface from which a nitride film has previously been removed;
    forming a titanium nitride film on said titanium film in accordance with a reactive sputtering process using a gas containing a nitrogen atom and the titanium target; and
    performing a heat treatment to react said cobalt film with said silicon substrate, thereby accomplishing silicification.

2. The forming method of a silicide film according to claim 1, wherein the nitride film on the surface of said titanium target that is previously removed is removed by sputtering said titanium target.

3. The forming method of a silicide film according to claim 1, wherein said gas containing the nitrogen atom is a nitrogen gas.

4. The forming method of a silicide film according to claim 1, wherein said forming the titanium nitride film is performed in a low temperature atmosphere such that the titanium nitride film contains titanium.

5. The forming method of a silicide film according to claim 1, wherein said forming the titanium nitride film is performed under temperature conditions that a temperature of said silicon substrate is within a range of 50° C. to 100° C.

6. The forming method of a silicide film according to claim 1, wherein said performing the heat treatment comprises:
   a first annealing for changing said cobalt film on said diffusion layer to a cobalt monosilicide film; and
   a second annealing for removing said titanium nitride film containing titanium and unreacted cobalt film, and then changing said cobalt monosilicide film to a cobalt disilicide film under higher temperature conditions than that of said first annealing.

7. The forming method of a silicide film according to claim 6, wherein said forming the cobalt film to said first annealing are continuously performed in a same equipment.

* * * * *